(12) United States Patent
Oh et al.

(10) Patent No.: US 8,689,082 B2
(45) Date of Patent: Apr. 1, 2014

(54) METHOD OF OPERATING MEMORY CONTROLLER, AND MEMORY SYSTEM, MEMORY CARD AND PORTABLE ELECTRONIC DEVICE INCLUDING THE MEMORY CONTROLLER

(75) Inventors: Eun-Chu Oh, Hwaseong-si (KR); Jae-Hong Kim, Seoul (KR); Yong-June Kim, Seoul (KR); Jun-Jin Kong, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/550,133

(22) Filed: Jul. 16, 2012

(65) Prior Publication Data

US 2013/0031443 A1    Jan. 31, 2013

(30) Foreign Application Priority Data

Jul. 28, 2011   (KR) ........................ 10-2011-0075297

(51) Int. Cl.
*H03M 13/00*   (2006.01)

(52) U.S. Cl.
USPC .......................................... 714/773; 714/764

(58) Field of Classification Search
USPC .......................................... 714/723, 764, 773
See application file for complete search history.

(56) References Cited

U.S. PATENT DOCUMENTS

| | | | |
|---|---|---|---|
| 6,058,047 A | 5/2000 | Kikuchi | |
| 6,339,546 B1 * | 1/2002 | Katayama et al. | 365/185.09 |
| 7,573,773 B2 | 8/2009 | Lin | |
| 7,765,426 B2 | 7/2010 | Li | |
| 7,984,345 B2 * | 7/2011 | Ozawa et al. | 714/723 |
| 8,156,392 B2 * | 4/2012 | Flynn et al. | 714/723 |
| 2006/0117214 A1 * | 6/2006 | Sugiura et al. | 714/5 |
| 2007/0186065 A1 * | 8/2007 | Lee et al. | 711/159 |
| 2009/0216938 A1 * | 8/2009 | Conley et al. | 711/103 |
| 2010/0070801 A1 * | 3/2010 | Cornwell et al. | 714/6 |
| 2011/0170348 A1 * | 7/2011 | Cornwell et al. | 365/185.03 |
| 2012/0226962 A1 * | 9/2012 | Franceschini et al. | 714/766 |

FOREIGN PATENT DOCUMENTS

KR    2010-0115970 A    10/2010

OTHER PUBLICATIONS

Sasan, A.; Homayoun, H.; Eltawil, A.; Kurdahi, F.; , "Process Variation Aware SRAM/Cache for aggressive voltage-frequency scaling," Design, Automation & Test in Europe Conference & Exhibition, 2009. Date '09. , vol., no., pp. 911-916, Apr. 20-24, 2009.*

\* cited by examiner

*Primary Examiner* — Cynthia Britt
(74) *Attorney, Agent, or Firm* — Harness, Dickey & Pierce, P.L.C.

(57) ABSTRACT

A method of operating a memory controller includes reading data from a first block of a memory device; detecting degraded pages from a plurality of pages of the first block and counting a number of the degraded pages in the first block; and recharging or reclaiming the first block, which includes the degraded pages, based on the counted number of the degraded pages.

14 Claims, 9 Drawing Sheets

METHOD OF OPERATING MEMORY CONTROLLER, AND MEMORY SYSTEM, MEMORY CARD AND PORTABLE ELECTRONIC DEVICE INCLUDING THE MEMORY CONTROLLER

This application claims priority under 35 U.S.C. §119 to Korean Patent Application No. 10-2011-0075297 filed on Jul. 28, 2011 in the Korean Intellectual Property Office, the entire disclosure of which is incorporated herein by reference.

BACKGROUND

1. Field

Example embodiments of inventive concepts relate to a method of operating a memory controller, and/or a memory system, a memory card and a portable electronic device including a memory controller.

2. Description of the Related Art

Memory devices may be classified into volatile memory devices and nonvolatile memory devices. Volatile memory devices lose data when the power supply is turned off. On the other hand, nonvolatile memory devices retain data even when the power supply is turned off.

Examples of nonvolatile memory devices include read-only memories (ROMs) and electrically erasable programmable read-only memories (EEPROMs).

The structure and operation of flash memory devices introduced as flash EEPROMs are different from those of conventional EEPROMs. A flash memory device may perform an electronic erase operation on a block-by-block basis and a program operation on a bit-by-bit basis.

Threshold voltages of programmed memory cells included in a flash memory device may change due to various causes, including floating gate coupling and charge loss over time. Thus, a change in the threshold voltages of the memory cells may undermine the reliability of read data.

SUMMARY

Example embodiments of inventive concepts provide a method of operating a memory controller which may improve the reliability of read data.

Example embodiments of inventive concepts also provide a memory system which improves the reliability of read data.

Example embodiments of inventive concepts also provide a memory card which improves the reliability of read data.

Example embodiments of inventive concepts also provide a portable electronic device which improves the reliability of read data.

However, example embodiments of inventive concepts are not restricted to those set forth herein. The above and other aspects of the inventive concepts will become more apparent to one of ordinary skill in the art to which the present inventive concept pertains by referencing the detailed description of example embodiments of inventive concepts given below.

According to example embodiments of inventive concepts, there is provided a method of operating a memory controller, the method comprising: reading data from a first block of a memory device; detecting degraded pages from a plurality of pages of the first block and counting a number of the degraded pages in the first block; and recharging or reclaiming the first block, which comprises the degraded pages, based on the counted number of the degraded pages According to example embodiments of inventive concepts, there is provided a memory system comprising: a nonvolatile memory device including a first block which includes a plurality of pages; and a controller configured to control the nonvolatile memory device, wherein the controller comprises: a microprocessor configured to detect degraded pages from the pages of the first block; and a counter configured to count a number of the detected degraded pages and provide the counted number of the degraded pages to the microprocessor, wherein the microprocessor is configured to recharge or reclaim the first block based on the counted number of the degraded pages.

According to example embodiments of inventive concepts, there is provided a memory system comprising: a 3D nonvolatile memory device including a first block which includes a plurality of layers, each having a plurality of pages; and a memory controller configured to control the operation of the 3D nonvolatile memory device, wherein the memory controller includes: a microprocessor configured to detect degraded pages from the pages of the first block; and a counter configured to count a number of the detected degraded pages and provide the counted number of the degraded pages to the microprocessor, wherein the microprocessor is configured to recharge or reclaim the first block based on the counted number of the degraded pages.

According to example embodiments of inventive concepts, there is provided a memory card comprising: a nonvolatile memory device comprising a first block which includes a plurality of pages; a card interface configured to communicate with a host; and a memory controller configured to control communication between the nonvolatile memory device and the card interface, wherein the memory controller includes: a microprocessor configured to detect degraded pages from the pages of the first block; and a counter configured to count a number of the detected degraded pages and provide the counted number of the degraded pages to the microprocessor, wherein the microprocessor is configured to recharge or reclaim the first block based on the counted number of the degraded pages.

According to example embodiments of inventive concepts, there is provided a portable electronic device comprising: a nonvolatile memory device including a first block which includes a plurality of pages; a memory controller configured to control the operation of the nonvolatile memory device; and a display configured to display data output from the nonvolatile memory device under the control of the memory controller, wherein the memory controller includes: a microprocessor configured to detect degraded pages from the pages of the first block; and a counter configured to count a number of the detected degraded pages and provide the counted number of the degraded pages to the microprocessor, wherein the microprocessor is configured to recharge or reclaim the first block based on the counted number of the degraded pages.

According to example embodiments of inventive concepts, a memory system may include: a memory device including a first block, the first block including a plurality of pages; and a memory controller configured to control the memory device, the memory controller including: a microprocessor configured to detect degraded pages of the first block; and a counter configured to count a number of the detected degraded pages of the first block.

According to example embodiments of inventive concepts, the microprocessor may be configured to reclaim or recharge the first block based on the counted number of degraded pages.

According to example embodiments of inventive concepts, the microprocessor may be configured to recharge the first block when the counted number of degraded pages is greater than a first reference value and less than or equal to a second reference value.

According to example embodiments of inventive concepts, the microprocessor may be configured to reclaim the first block to a second block when the counted number of degraded pages in the first block is greater than the second reference value.

According to example embodiments of inventive concepts, the second block may include second data generated by correcting error bits of first data from the first block.

According to example embodiments of inventive concepts, the microprocessor may be configured to determine a page to be a degraded page if a bit error rate of data read from a page of the first block is greater than a reference value.

According to example embodiments of inventive concepts, the microprocessor may be configured to determine a page to be a degraded page if the page fails to be read using a first read voltage but is read successfully using a second read voltage, and a difference between the first read voltage and the second read voltage is greater than a third reference value.

According to example embodiments of inventive concepts, the microprocessor may be configured to determine a page to be a degraded page based on time stamp information which includes information about a time when a corresponding page was programmed and is stored in a spare region of the corresponding page.

BRIEF DESCRIPTION OF THE DRAWINGS

Example embodiments of inventive concepts will become more apparent from the following description of the attached drawings, in which.

DETAILED DESCRIPTION OF EXAMPLE EMBODIMENTS

Figure 1:
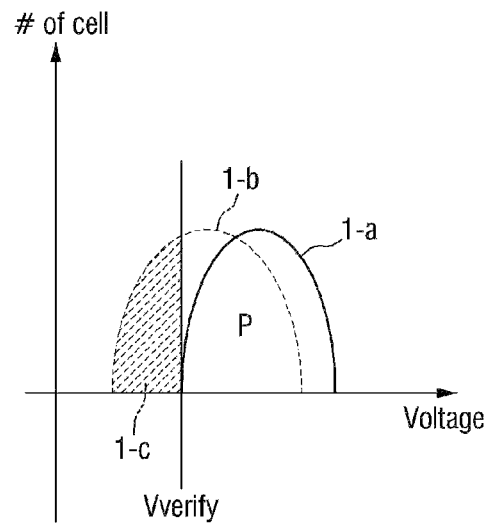
FIG. 1 is a graph illustrating the charge loss of a single-level cell (SLC) flash memory device.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a graph illustrating the charge loss of a single-level cell (SLC) flash memory device.

Referring to FIG. 1, charge loss is a phenomenon in which some of the electrons trapped in a storage layer (e.g., a floating gate) or a tunnel oxide layer of a flash memory device escape from the storage layer or the tunnel oxide layer as time elapses. As the number of times that program and erase operations are performed increases, the tunnel oxide layer may become degraded, thus increase the charge loss.

Specifically, the x axis represents voltage, and the y axis represents the number of memory cells. A first programmed state distribution 1-a is a programmed state distribution immediately after a program operation (i.e., before a charge loss occurs), and a second programmed state distribution 1-b is a programmed state distribution after a charge loss occurs. That is, a charge loss causes the first programmed state distribution 1-a to shift to the second programmed state distribution 1-b.

Still referring to FIG. 1, the first programmed state distribution 1-a is located to the right of a verify voltage Vverify, whereas a part 1-c of the second programmed state distribution 1-b is located to the left of the verify voltage Vverify. If the number of nonvolatile memory cells corresponding to the part 1-c of the second programmed state distribution 1-b is large, the nonvolatile memory cells corresponding to the part 1-c cannot be corrected using error correction code (ECC).

Figure 2:
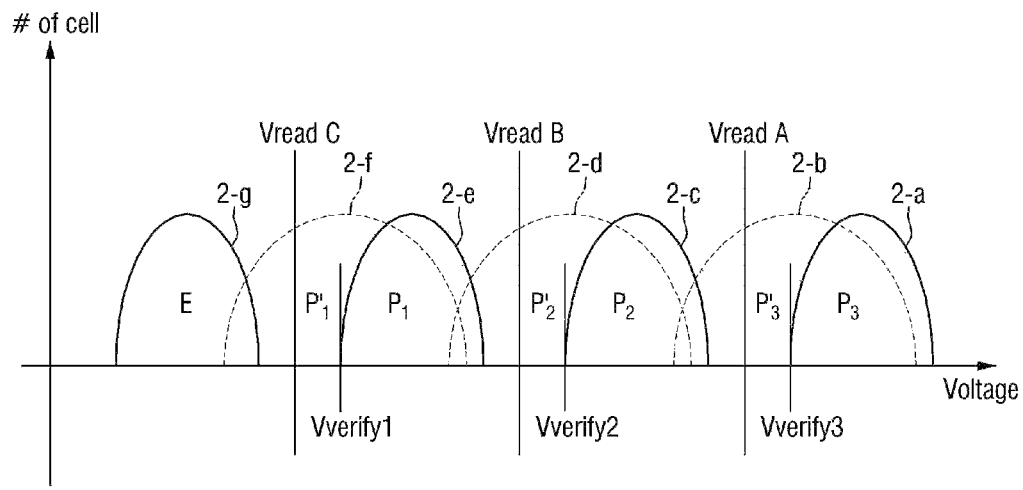
FIG. 2 is a graph illustrating the charge loss of a 2-bit multi-level cell (MLC) flash memory device.

FIG. 2 is a graph illustrating the charge loss of a 2-bit multi-level cell (MLC) flash memory device.

To program k bits into one memory cell of an MLC nonvolatile memory device, any one of $2^k$ threshold voltages should be formed in the memory cell. When 2 bits are stored in one memory cell, threshold voltages of memory cells programmed with the same data may form a certain range of threshold voltage distributions due to a delicate difference in electrical properties of memory cells. The threshold voltage distributions may correspond to $2^k$ data values that can be generated by the k bits, respectively.

Referring to FIG. 2, a 2-bit MLC nonvolatile memory device has three programmed state threshold voltage distributions (i.e., state distributions immediately after a program operation) $P_1$ (2-e), $P_2$ (2-c) and $P_3$ (2-a) and one erased state threshold voltage distribution E (2-g). The programmed state threshold voltage distributions $P_1$ (2-e), $P_2$ (2-c) and $P_3$ (2-a) do not overlap at all since no charge loss occurs immediately after a program operation. Each threshold voltage distribution has a read voltage. Therefore, the 2-bit MLC nonvolatile memory device has three read voltages Vread A, Vread B, and Vread C. The read voltages Vread A, Vread B and Vread C may be, but are not limited to, default voltages predetermined in a manufacturing process. In the FIG. 2, the 2-bit MLC nonvolatile memory device is illustrated as an example. However, example embodiments of inventive concepts are not limited by this example. A 3-bit MLC nonvolatile memory may have seven programmed state threshold voltage distributions and one erased state threshold voltage distribution, and a 4-bit MLC nonvolatile memory may have fifteen programmed state threshold voltage distributions and one erased state threshold voltage distribution.

As the 2-bit MLC nonvolatile memory device is repeatedly programmed and erased over a relatively long period of time, properties of flash memory cells may be degraded, causing a charge loss. FIG. 2 is an example of the programmed and erased state threshold voltage distributions that can be changed by the charge loss.

As described above with reference to FIG. 1, a nonvolatile memory device may experience a charge loss as a result of the release of electrons from a floating gate or a tunnel oxide layer over time. In addition, as the nonvolatile memory device is programmed and erased repeatedly, the tunnel oxide layer may be degraded, thus increasing the charge loss. Since the charge loss can reduce threshold voltages, the distribution of threshold voltages may be shifted to the left.

Therefore, referring to FIG. 2, memory cells experiencing charge loss may cause adjacent threshold voltage distributions to overlap each other. As shown in FIG. 2, E(2-g) and $P'_1(2-f)$ may overlap each other, $P'_1(2-f)$ and $P'_2(2-d)$ may overlap each other, and $P'_2(2-d)$ and $P'_3(2-b)$ may overlap each other. If threshold voltage distributions overlap, data read when a certain read voltage is applied may contain errors. For example, if a memory cell is in an on state when Vread A is applied, data read from the memory cell may belong to $P_2$. If the memory cell is in an off state, the read data may belong to $P_3$. However, in an overlap region of threshold voltage distributions (i.e. where $P'_2$ and $P'_3$ overlap), if a memory cell is in an on state, $P_3$ can still be read, thus creating an error bit. Therefore, when threshold voltage distributions overlap, read data may include error bits.

Figure 3:
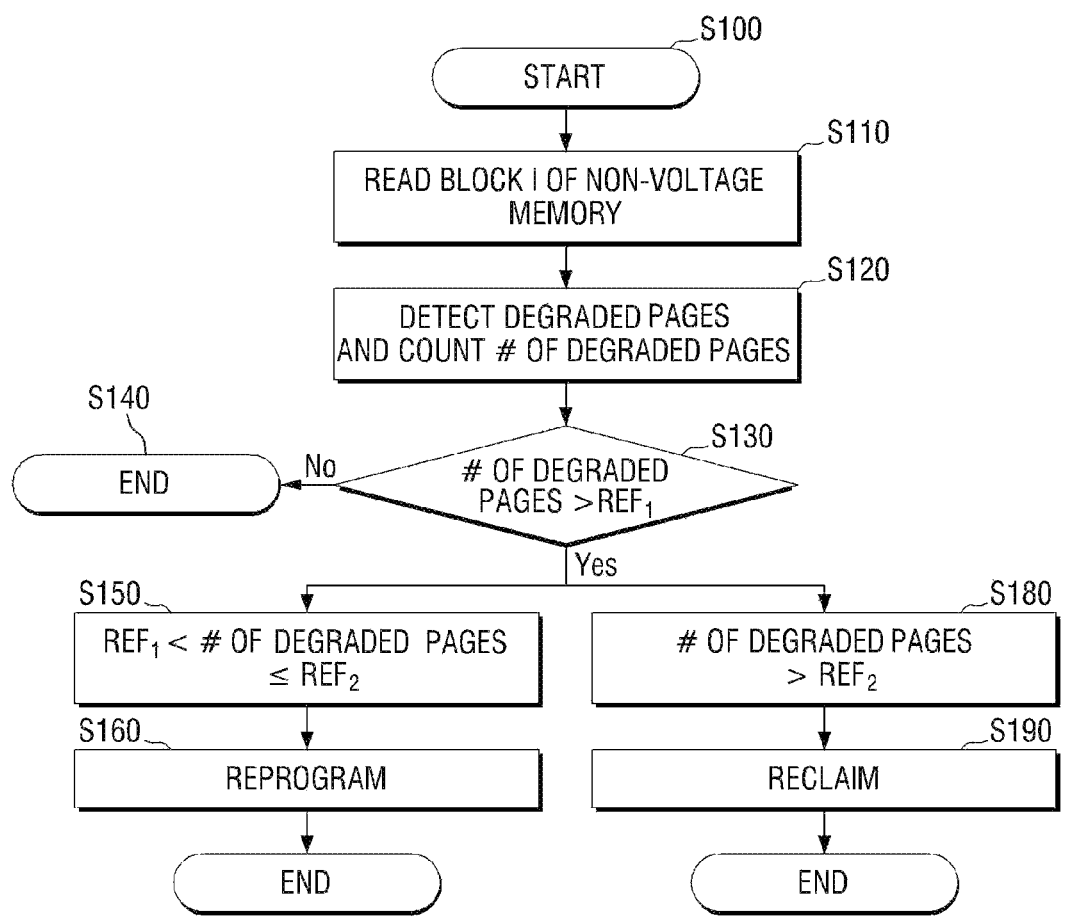
FIG. 3 is a flowchart illustrating a method of operating a memory controller according to example embodiments of the inventive concepts.

FIG. 3 is a flowchart illustrating a method of operating a memory controller according to at least one example embodiment of inventive concepts.

Referring to FIG. 3, data is read from a first block of a memory device (operation S110). The first block may include a plurality of pages and data may be read on a page-by-page basis.

A controller detects degraded pages from the pages of the first block and counts the number of the degraded pages in the first block (operation S120).

The first block including the degraded pages may be recharged (i.e., reprogrammed) depending on the counted number of the degraded pages. Specifically, when the counted number of the degraded pages is greater than a first reference value $REF_1$ (operation S130) and is less than or equal to a second reference value $REF_2$ (operation S150), the first block may be recharged (operation S160). The recharge operation is described in greater detail with reference to FIG. 5.

Still referring to FIG. 3, when the counted number of the degraded pages is greater than the second reference value $REF_2$ (operation S180), the first block may be reclaimed (operation S180). The reclaim operation is described in greater detail with reference to FIG. 7.

When the counted number of the degraded pages is smaller than the first reference value $REF_1$ (operation S130), the read operation is terminated (operation S140).

Referring to FIGS. 1 through 3, the charge loss described above with reference to FIGS. 1 and 2 changes a programmed state distribution. Thus, a degraded page may contain data whose programmed state distribution has been changed by the charge loss.

A degraded page may be detected (see operation S120) as follows. In a method of operating a memory controller according to at least one example embodiment of inventive concepts, when a bit error rate of data read from a page is greater than a reference level, the memory controller may determine the page to be a degraded page. Specifically, data may be read on a page-by-page basis. Data read from a page is input to an ECC decoder, and the ECC decoder identifies the locations of error bits in the received data and corrects the error bits. For example, the ECC decoder may calculate a bit error rate of the received data.

Alternatively, a method of operating a memory controller according to at least one other example embodiment of inventive concepts, the memory controller may perform multiple read operations and, when a difference between read voltages used for the read operations is greater than a reference value, determine a corresponding page to be a degraded page. Specifically, the memory controller may perform read operations using a first read voltage and a second read voltage which is different from the first read voltage. When the difference between the first read voltage and the second read voltage is greater than a third reference value, the memory controller may determine a corresponding page to be a degraded page. The memory controller may read data using the first read voltage. When the memory controller fails to read the data using the first read voltage, it reads the data again using the second read voltage which is different from the first read voltage. For example, the second read voltage is a voltage used when data is read successfully. The multiple read operations are described in greater detail with reference to FIG. 5.

Alternatively, in a method of operating a memory controller according to at least one other example embodiment of inventive concepts, the memory controller may detect a degraded page based on time stamp information. The time stamp information may indicate the time when a page was programmed. The time stamp information may be stored in a spare region of a page, described with reference to FIG. 6. The time stamp information may be stored in, but not limited to, each block or page. Based on the time stamp information, the memory controller may determine a page, into which data was programmed before a reference time, to be a degraded page. That is, the memory controller may determine a page programmed with relatively old data to be a degraded page.

Figure 4:
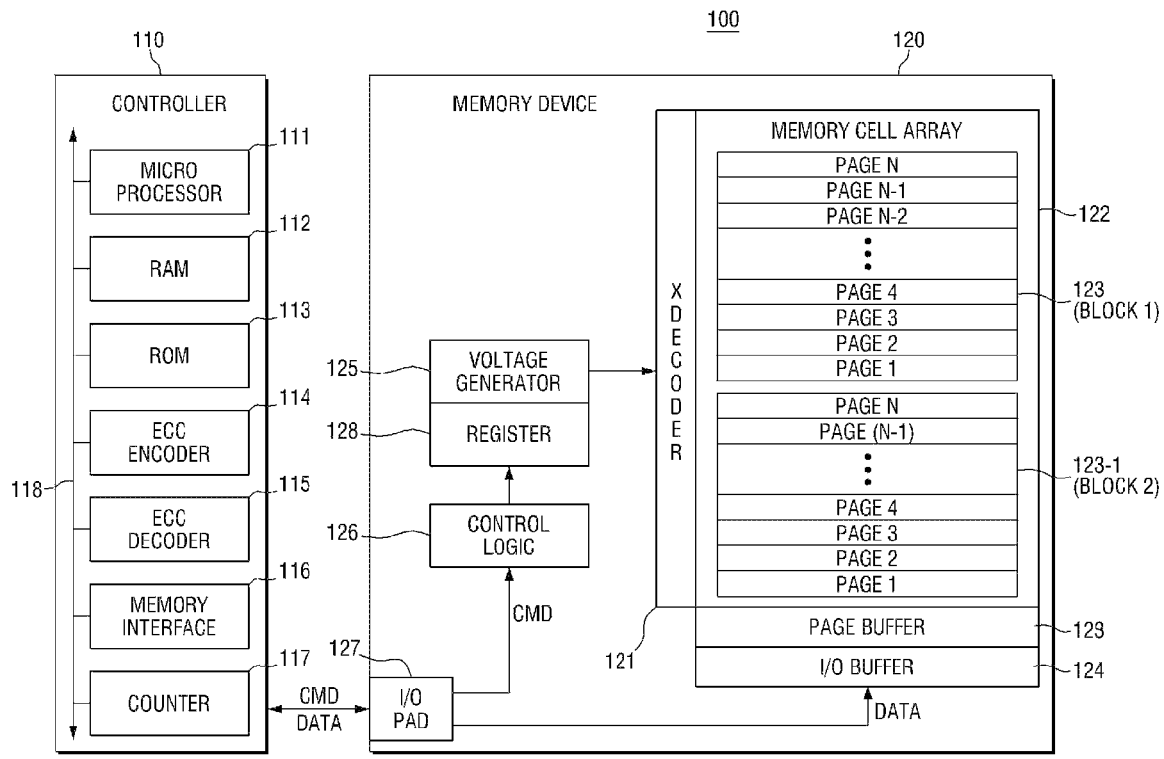
FIG. 4 is a block diagram of a memory system 100 according to at least one example embodiment of inventive concepts.

FIG. 4 is a block diagram of a memory system 100 according to at least one example embodiment of inventive concepts. Referring to FIG. 4, the memory system 100 includes a controller 110 and a nonvolatile memory device 120. In FIG. 4, a NAND flash memory device is used as an example of the nonvolatile memory device 120. However, the present inventive concept is not limited thereto. The nonvolatile memory device 120 may include a plurality of NAND flash memory devices. The nonvolatile memory device 120 may include a planar memory cell structure and a 3D memory cell structure formed by stacking memory cells.

The nonvolatile memory device 120 may include a memory cell array 122, an X-decoder (a row selection circuit) 121, a voltage generator 125, an input/output (I/O) pad 127, an I/O buffer 124, a page buffer 129, and a control logic 126.

The memory cell array 122 includes a plurality of word lines W/L and a plurality of bit lines B/L. Each memory cell may store 1-bit data or M-bit data (where M is a natural number greater than or equal to two). Each memory cell may include a charge storage layer such as a floating gate or a charge trapping layer or a memory cell may include a variable resistor.

The memory cell array 122 may include a plurality of blocks and a plurality of pages. One block may include a plurality of pages. A page may be involved in program and read operations, and a block may be involved in erase operations. In a read operation, data programmed into one page is read.

The memory cell array 122 may be a single-layer array structure (i.e. a 2D array structure) or a multi-layer array structure (i.e. a 3D array structure). The 3D array structure is described with reference to FIGS. 8 through 10.

Still referring to FIG. 4, the control logic 126 controls the overall operation of the nonvolatile memory device 120. When a command CMD is input from the controller 110, the control logic 126 interprets the command CMD and instructs the nonvolatile memory device 120 to perform an operation (e.g., a program operation, a read operation, a read retry operation, or an erase operation) corresponding to the interpreted command CMD. In addition, the control logic 126 may store information about degraded pages and count the number of the degraded pages. The control logic 126 may also store information about the counted number of the degraded pages.

The X-decoder 121 is controlled by the control logic 126 and drives at least one of the word lines W/L included in the memory cell array 122 according to a row address.

The voltage generator 125 is controlled by the control logic 126 to generate one or more voltages required for a program operation, a first read operation, a second read operation or an erase operation. The generated voltages are provided to one or more memory cells selected by the X-decoder 121.

A register 128 may store information input from the memory controller 110 and may include a plurality of latches. For example, the register 128 may group read voltage information and store the information in the form of a table.

The page buffer 129 is controlled by the control logic 126 and may operate as a sense amplifier or a write driver according to an operation mode (e.g., a read operation or a program operation).

The I/O pad 127 and the I/O buffer 124 may serve as an I/O path of data exchanged between an external device (e.g., the controller 110 or a host) and the nonvolatile memory device 120.

The controller 110 may include a microprocessor 111, a read-only memory (ROM) 113, a random access memory (RAM) 112, an ECC decoder 115, an ECC encoder 114, a memory interface 116, and a bus 118. The elements 111 through 117 of the controller 110 may be electrically connected to each other through the bus 118.

The microprocessor 111 controls the overall operation of the memory system 100 including the memory controller 110. When power is supplied to the memory system 100, the microprocessor 111 drives firmware (stored in the ROM 113) for operating the memory system 100 on the RAM 112, thereby controlling the overall operation of the memory system 100.

In FIG. 4, driving firmware code of the memory system 100 may be stored in the ROM 113. However, the example embodiments are not limited thereto. The firmware code may also be stored in the nonvolatile memory device 120. Therefore, the control of the microprocessor 111 may encompass not only the direct control of the microprocessor 111, but also the intervention of firmware which is software driven by the microprocessor 111.

The RAM 112, which is a memory serving as a buffer, may store an initial command, data, and variables input from the host or data output from the nonvolatile memory device 120. The RAM 112 may store data and various parameters and variables input to and output from the nonvolatile memory device 120.

The memory interface 116 may serve as an interface between the memory controller 110 and the nonvolatile memory device 120. The memory interface 116 is connected to the I/O pad 127 of the nonvolatile memory device 120 and may exchange data with the I/O pad 127. In addition, the memory interface 116 may create a command suitable for the nonvolatile memory device 120 and provide the created command to the I/O pad 127 of the nonvolatile memory device 120. The memory interface 116 provides a command to be executed by the nonvolatile memory device 120 and an address ADD of the nonvolatile memory device 120.

The ECC decoder 115 and the ECC encoder 114 may perform error bit correction. The ECC encoder 114 generates data added with parity bits by performing error correction encoding on data provided to the nonvolatile memory device 120. The parity bits may be stored in the nonvolatile memory device 120.

The ECC decoder 115 performs error correction decoding on output data, determines whether the error correction decoding is successful based on the result of the error correction decoding, and outputs an instruction signal based on the determination result. Read data may be transmitted to the ECC decoder 115, and the ECC decoder 115 may correct error bits of the data using the parity bits. When the number of error bits exceeds a limit number of error bits that can be corrected, the ECC decoder 115 cannot correct the error bits, resulting in an error correction failure. The ECC encoder 114 and the ECC decoder 115 may perform error correction using, but not limited to, low density parity check (LDPC) code, BCH code, turbo code, Reed-Solomon code, convolution code, recursive systematic code (RSC), or coded modulation such as trellis-coded modulation (TCM) or block coded modulation (BCM), etc.

Each of the ECC encoder 114 and the ECC decoder 115 may include an error correction circuit, system or device.

According to at least one example embodiment, the counter 117 may store information about degraded pages and count the number of the degraded pages. In addition, the counter 117 may store information about the counted number of the degraded pages.

Referring to FIG. 4, the memory interface 116 provides a read command and an address to the nonvolatile memory device 120. The nonvolatile memory device 120 reads data from pages of a first block 123 corresponding to the received address. The read data is provided to the ECC decoder 115 via the I/O pad 127. The ECC decoder 115 checks error bits of the data provided by the nonvolatile memory device 120 and corrects the error bits.

Referring to FIG. 4, the microprocessor 111 detects degraded pages and the counter 117 stores information about the degraded pages and counts the number of the degraded pages.

A degraded page may be detected as described above. Specifically, referring to FIGS. 1, 2 and 4, the charge loss described above with reference to FIGS. 1 and 2 changes a programmed state distribution. Thus, a degraded page may be a page that contains data whose programmed state distribution has been changed by the charge loss.

According to at least one example embodiment of inventive concepts, when a bit error rate of data read from a page is greater than a reference level, the controller 110 may determine the page to be a degraded page. The ECC decoder 115 checks error bits of data received from the nonvolatile memory device 120 and calculates the bit error rate of the data. When the calculated bit error rate is greater than a reference level, the microprocessor 111 determines a page from which the data was read to be a degraded page and provides information about the degraded page to the counter 117. The counter 117 receives and stores the information about the degraded page.

The counter 117 counts the number of degraded pages in a first block using the information stored therein. The microprocessor 111 determines whether to reprogram (recharge) the first block or reclaim the first block based on the counted number of the degraded pages.

For example, when the counted number of the degraded pages is less than a first reference value $REF_1$ (see FIG. 3), the read operation is terminated. When the counted number of the degraded pages is greater than the first reference value $REF_1$ and is less than or equal to a second reference value $REF_2$ (see FIG. 3), the microprocessor 111 may determine to recharge the first block. The recharge operation may reprogram data whose error bits have been corrected by the ECC decoder 115 into a page with the same address as a page from which the data was read.

When the counted number of the degraded pages is greater than the second reference value $REF_2$, the microprocessor 111 determines to reclaim the first block. The reclaim operation may correct error bits of data read from the first block using the ECC decoder 115 and program the error bit-corrected data into a second block. The first block and the second block are blocks with different physical addresses.

According to at least one other example embodiment, the controller 110 may perform multiple read operations and, when a difference between read voltages is greater than a reference value, determine a corresponding page to be a degraded page. Specifically, the controller 110 may perform read operations using a first read voltage and a second read voltage which is different from the first read voltage. When the difference between the first read voltage and the second read voltage is greater than a third reference value, the controller 110 may determine a corresponding page to be a degraded page.

The ECC decoder 114 may correct error bits of read data in a degraded page. However, when the number of error bits exceeds a reference value, the error bits cannot be corrected, resulting in a read failure. When failing to read data from an address in the memory cell array 122, the microprocessor 111 reads data from the same address using the second read voltage which is smaller than the first read voltage. Error bits of the data read using the second read voltage are correctable. When the difference between the first read voltage and the second read voltage is greater than the third reference value, the microprocessor 111 determines a corresponding page to be a degraded page. Reading data again using the second voltage will be described later with reference to FIG. 5.

According to at least one other example embodiment of inventive concepts, the controller 110 may detect a degraded page with reference to time stamp information. The time stamp information is data indicating the time when program data was programmed. When data is programmed into a page, the time stamp information may be stored in a spare region of the page or in another block. The microprocessor 111 may detect a degraded page with reference to the time stamp information. The time stamp information may be provided in each block or page.

The microprocessor 111 may detect a degraded page according to at least the above example embodiments and provide information about the degraded page (e.g., an address of the degraded page) to the counter 117. With reference to the stored information about the degraded pages, the counter 117 may count the number of the degraded pages in the first block. The microprocessor 111 may recharge the first block when the counted number of the degraded pages is greater than or equal to the first reference value $REF_1$ and is less than the second reference value $REF_2$. The microprocessor 111 may reclaim the first block when the counted number of the degraded pages is greater than the second reference value $REF_2$.

Figure 5:
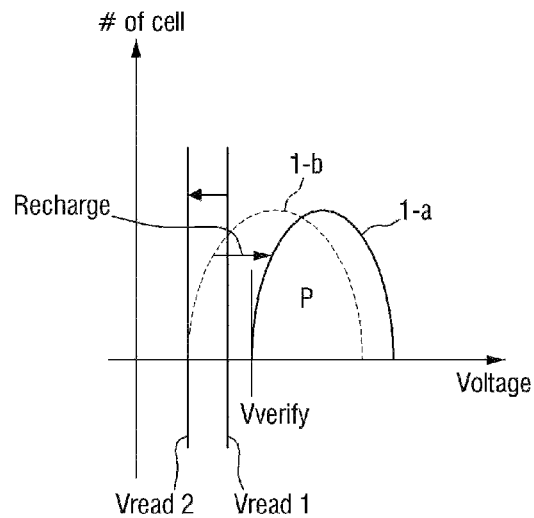
FIG. 5 is a conceptual diagram illustrating the change in read voltage and a recharge operation.

FIG. 5 is a conceptual diagram illustrating the change in read voltage and a recharge operation.

Referring to FIG. 5, the x axis represents voltage, and the y axis represents the number of memory cells. A first programmed state distribution 1-a located to the right of a verify voltage Vverify and a second programmed state distribution 1-b after a charge loss are illustrated in FIG. 5. When memory cells corresponding to the second programmed state distribution 1-b are read using a first read voltage Vread1, error bits uncorrectable by an ECC decoder may be produced, resulting in the failure of the read operation. Therefore, the memory cells may be read again by applying a read voltage lower than the first read voltage Vread1. A second read voltage Vread2 is a voltage used to read second data which does not contain uncorrectable error bits. In FIG. 5, when the nonvolatile memory data is read using the second read voltage Vread2, the read operation does not fail. Until the error bit-correctable second data is received, the read operation may be repeated using at least one third read voltage which is gradually reduced from the first read voltage Vread1.

Referring to FIG. 5 and according to at least one example embodiment, degraded pages may be detected based on the difference between the first read voltage Vread1 and the second read voltage Vread2, and the number of the degraded pages in a first block may be counted. Based on the counted number of the degraded pages, the first block may be determined to be recharged. The recharge operation may correct error bits of data read using the second read voltage Vread2 and program the error bit-corrected data into a page from which the data was read. Therefore, the recharge operation increases a programmed state distribution (1-$b$) (caused by a charge loss) to a programmed state distribution (1-$a$) (the state before a charge loss). Therefore, even if a programmed state distribution of a nonvolatile memory is changed by a charge loss, the recharge operation may reestablish a programmed state distribution before the charge loss without an erase operation. The recharge operation improves the reliability of the nonvolatile memory.

Figure 6:
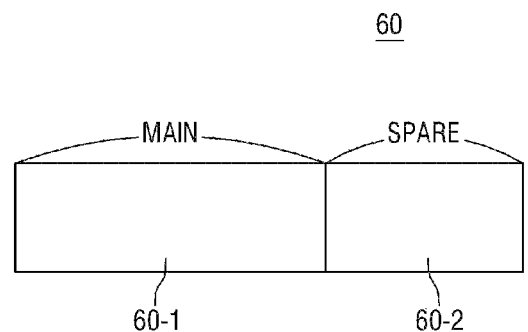
FIG. 6 is a diagram illustrating one page of the nonvolatile memory device 120 shown in FIG. 4.

FIG. 6 is a diagram illustrating one page of the nonvolatile memory device 120 shown in FIG. 4. Referring to FIG. 6, a page 60, which is a unit of program and read operations, includes a main region 60-1 and a spare region 60-2. The main region 60-1 may store data provided by a host. The spare region 60-2 may store metadata related to the data of the main region 60-1, (e.g. time stamp data, etc.).

Figure 7:
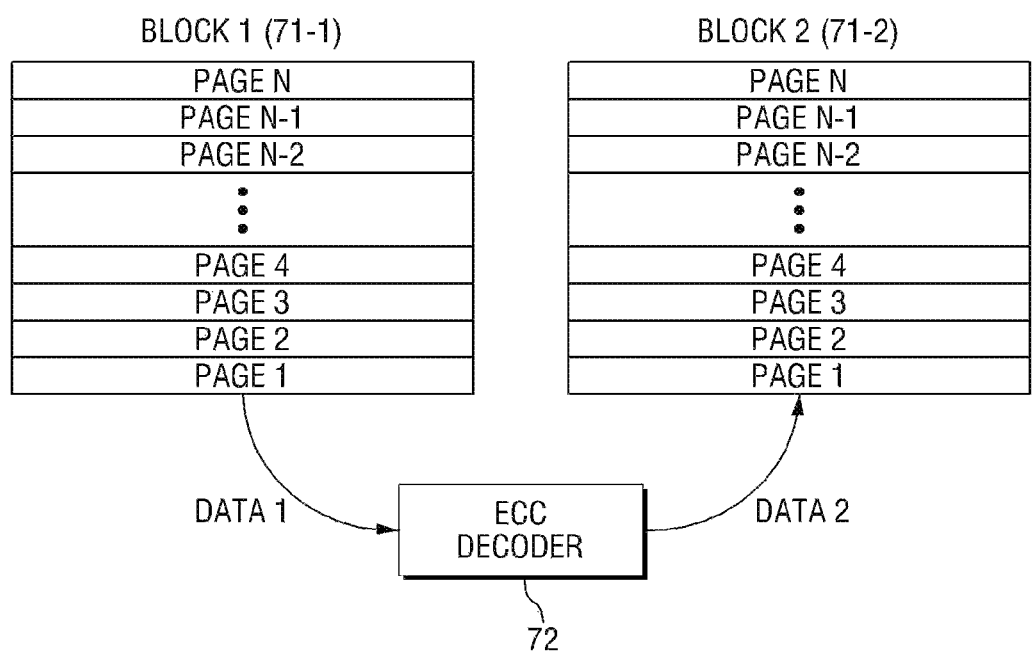
FIG. 7 is a conceptual diagram illustrating a reclaim operation according to at least one example embodiment inventive concepts.

FIG. 7 is a conceptual diagram illustrating a reclaim operation according to at least one example embodiment of inventive concepts. In FIG. 7, first and second blocks 71-1 and 71-2 of a nonvolatile memory and an ECC decoder 72 are illustrated. According to at least one example embodiment, degraded pages may be detected from pages of the first block 71-1 of the nonvolatile memory, and the number of the degraded pages in the first block 71-1 may be counted. Based on the counted number of the degraded pages, the pages of the first block 71-1 may be determined to be reclaimed to the second block 71-2. When the counted number of the degraded pages in the first block 71-1 is greater than a second reference value, the first block 71-1 may be reclaimed to the second block 72-2. In the reclaim operation, first data DATA1 is read from the first block 71-1, and error bits of the read first data DATA1 are provided to the ECC decoder 72. Then, the ECC decoder 72 provides second data DATA2 obtained by correcting the error bits of the first data DATA1. The reclaim operation may program the second data DATA2 obtained by correcting the error bits of the first data DATA1 into the second block 71-2.

Specifically, the second data DATA2 obtained by correcting the first data DATA1 read from each page of the first block 71-1 is programmed into each page of the second block 71-2. Accordingly, the first block 71-1 may become an available block which may be used in future reclaim operations. Programming the second data DATA2 into an erased block made available by previous reclaim operations may improve the capability of managing error bits of data.

Figure 8:
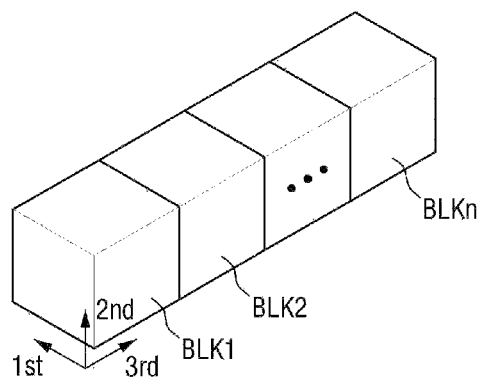
FIG. 8 is an example block diagram of the memory cell array 122 shown in FIG. 4.

FIG. 8 is an example block diagram of the memory cell array 122 shown in FIG. 4. FIG. 8 shows a 3D nonvolatile memory cell array 80.

Referring to FIG. 8, the 3D nonvolatile memory cell array 80 includes a plurality of memory blocks BLK1 through BLKn. Each of the memory blocks BLK1 through BLKn has a 3D structure (or a vertical structure). For example, each of the memory blocks BLK1 through BLKn includes structures stacked in first through third directions. Specifically, each of the memory blocks BLK1 through BLKn include a plurality of NAND strings NS stacked in the second direction $2^{nd}$. In addition, a plurality of NAND strings NS are provided in the first and third directions $1^{st}$ and $3^{rd}$. Each NAND string NS is connected to a bit line BL, a string select line SSL, a ground select line GSL, word lines WL, and a common source line CSL. This is described with reference to FIG. 10.

Figure 9:
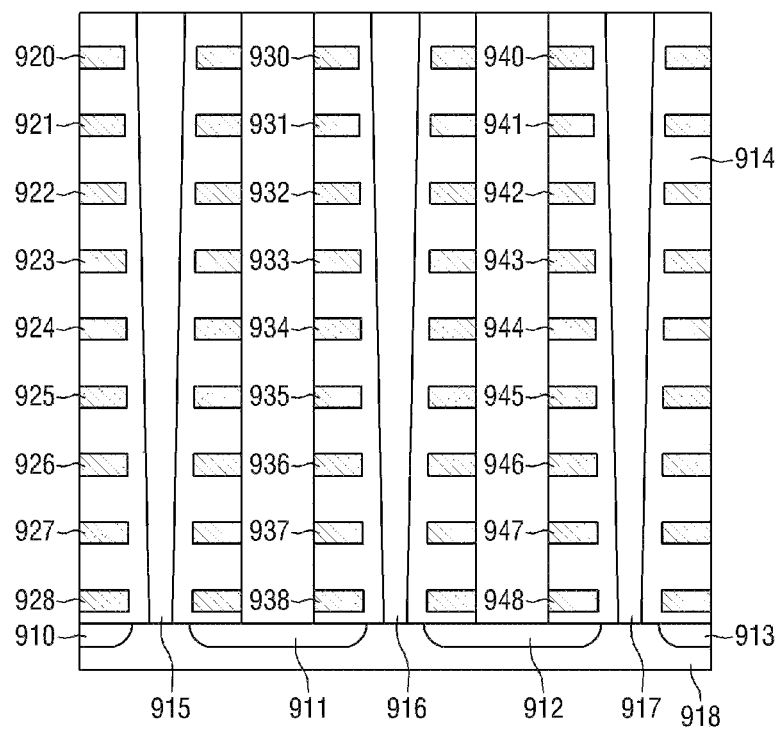
FIG. 9 is a cross-sectional view of one of the memory blocks BLK1 through BLKz shown in FIG. 8.

FIG. 9 is a cross-sectional view of one of the memory blocks BLK1 through BLKn shown in FIG. 8.

Referring to FIG. 9, one block 900 includes a silicon substrate 918, a plurality of doping regions 910 through 913 formed in the silicon substrate 918, insulating materials 914 which separate memory cells, a plurality of control gates 920 through 928, 930 through 938 and 940 through 948 which control the operation of the memory cells, and a plurality of pillars or channel holes 915 through 917 which penetrate the insulating materials 914 in a direction perpendicular to the silicon substrate 918.

The memory block 900 may include the silicon substrate 918, and a plurality of doping regions 910 through 913 formed in a horizontal direction in the silicon substrate 918.

The insulating materials 914 are stacked in the direction perpendicular to the silicon substrate 918 and disposed between the doping regions 910 through 913. The insulating materials 914 may contain an insulating material such as silicon oxide.

The control gates 920 through 928, 930 through 938 and 940 through 948 are formed between the stacked insulating materials 914 using a conductive material. The number of the control gates 920 through 928, 930 through 938 and 940 through 948 may determine a height of the block 900 of a 3D memory cell array. The control gates 920 through 928, 930 through 938 and 940 through 948 may be stacked in the direction perpendicular to the silicon substrate 918. Thus, the control gates 920 through 928, 930 through 938 and 940 through 948 may be at a higher height as a vertical distance from the silicon substrate 910 increases. That is, the control gates 920 through 928, 930 through 938 and 940 through 948 are connected to each other in a direction horizontal to the silicon substrate 918 to form word lines.

The pillars or channel holes 915 through 917 penetrate the insulating materials 914 and are formed on the silicon substrate 918 between the doping regions 910 through 913. One block 900 includes a plurality of pillars or channel holes 915 through 917. The pillars or channel holes may be filled with an insulating material such as silicon oxide.

A cross-sectional area of each of the pillars or channel holes 915 through 917 taken along the direction perpendicular to the silicon substrate 918 may be reduced as the distance to the silicon substrate 918 decreases. Due to processing characteristics or structural characteristics of a 3D memory, the cross-sectional area of each of the pillars or channel holes 915 through 917 may be reduced as the distance to the silicon substrate 918 decreases.

The smaller the cross-sectional area of each of the pillars 915 through 917, the greater the charge loss of the memory cells. In at least one example embodiment of inventive concepts, degraded pages may be detected in each block 900, and the number of the degraded pages may be counted. Then, a recharge or reclaim operation may be performed, thereby preventing a data loss caused by a charge loss. If 3D nonvolatile memory cells whose charge loss may increase are recharged or reclaimed according to example embodiments of inventive concepts, data reliability may be improved.

Figure 10:
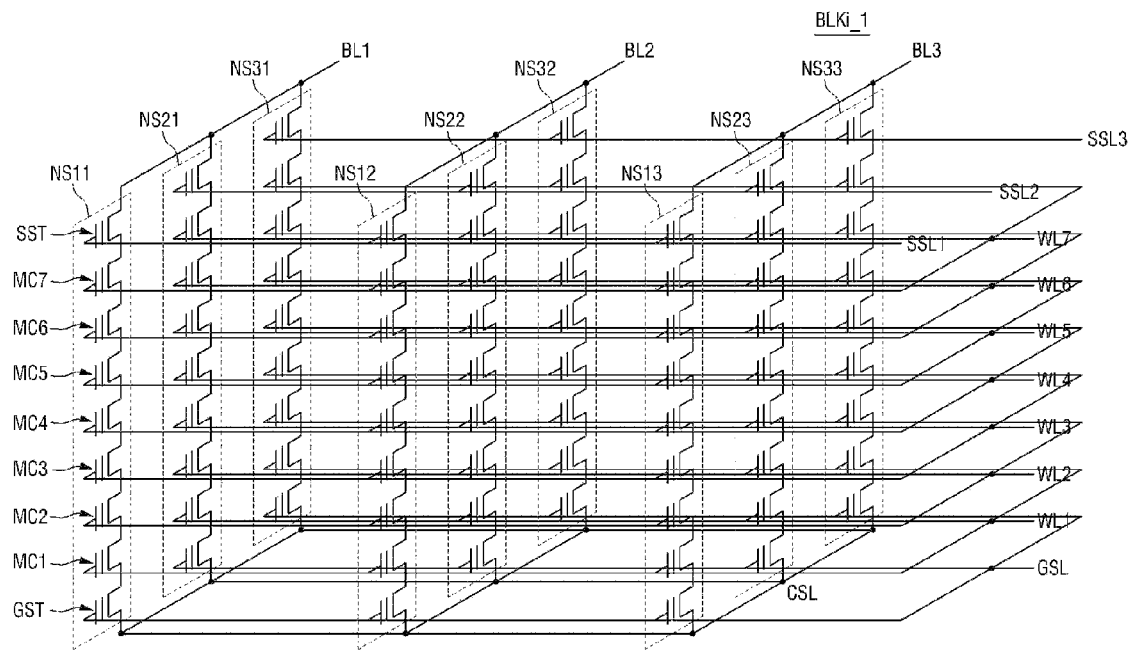
FIG. 10 is an equivalent circuit diagram of one block 900 of the 3D nonvolatile memory cell array 80 shown in FIGS. 8 and 9.

FIG. 10 is an equivalent circuit diagram of one block 900 of the 3D nonvolatile memory cell array 80 shown in FIGS. 8 and 9.

Referring to FIG. 10, NAND strings NS11 through NS31 are provided between a first bit line BL1 and a common source line CSL, NAND strings NS12, NS22 and NS32 are provided between a second bit line BL2 and the common source line CSL, and NAND strings NS13, NS23 and NS33 are provided between a third bit line BL3 and the common source line CSL. A string select transistor SST of each NAND string NS is connected to a corresponding bit line BL. A ground select transistor GSP of each NAND string NS is connected to the common source line CSL. Memory cells MC are located between the string select transistor SST and the ground select transistor GST of each NAND string NS. NAND strings NS commonly connected to one bit line BL form one column. The memory cells MC are at a higher height as the distance from the ground select transistor GST increases.

For example, of first through seventh memory cells MC1 through MC7, MC1 is lowest, and MC7 is highest. As described above with reference to FIG. 9, memory cells at low heights may experience more charge loss due to processing and structural causes. Accordingly, these memory cells may be more degraded.

Memory cells MC at the same height share a word line WL of memory cells MC of NAND strings NS in the same row. The word lines WL1 through WL7 of NAND strings NS, which are at the same height and correspond to different rows, are commonly connected.

Figure 11:
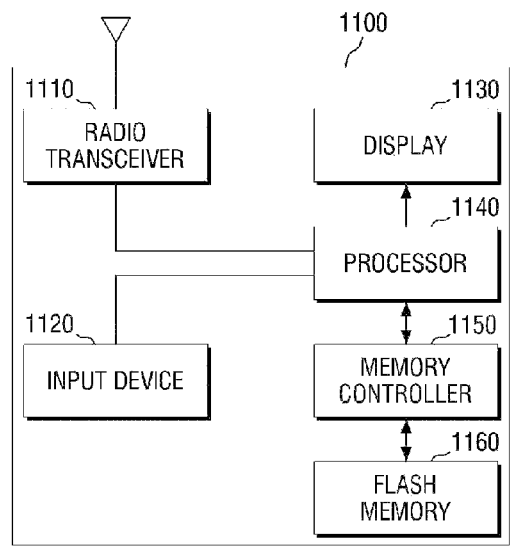
FIG. 11 is a block diagram of an electronic device 1100 including a memory controller 1150 according to at least one example embodiment of inventive concepts.

FIG. 11 is a block diagram of an electronic device 1100 including a memory controller 1150 according to at least one example embodiment of inventive concepts.

Referring to FIG. 11, the electronic device 1100 may be a cellular phone, a smart phone or a table personal computer (PC), etc. The electronic device 1100 may include a nonvolatile memory device 1160 which may be a flash memory device and the memory controller 1150 which may control the operation of the nonvolatile memory device 1160.

The memory controller 1150 may be the controller 110 shown in FIG. 4. Referring to FIGS. 4 and 11, the memory controller 1150 reads data from the first block 123 of the nonvolatile memory device 120, the first block 123 including a plurality of pages. The memory controller 1150 may detect degraded pages from the pages of the first block 123, count the number of the degraded pages in the first block 123, and determine whether to recharge or reclaim the first block 123 based on the counted number of the degraded pages.

The memory controller 1150 may be controlled by a processor 1140 which controls the overall operation of the electronic device 1100.

The memory controller 1150, which is controlled by the processor, 1140 may cause data stored in the nonvolatile memory device 1160 to be displayed on a display 1130.

A radio transceiver 1110 may receive or transmit radio signals through an antenna ANT. For example, the radio transceiver 1110 may convert a radio signal received through the antenna ANT into a signal that can be processed by the processor 1140. Therefore, the processor 1140 may process the signal output from the radio transceiver 1110 and store the processed signal in the nonvolatile memory device 1160 via the memory controller 1150 or display the processed signal on the display 1130.

The radio transceiver 1110 may convert a signal output from the processor 1140 into a radio signal and transmit the radio signal through the antenna ANT.

An input device 1120 may receive a control signal for controlling the operation of the processor 1140 or data to be processed by the processor 1140. The input device 1120 may be a pointing device such as a touchpad or computer mouse, a keypad, or a keyboard, etc.

The processor 1140 may cause the display 1130 to display data output from the nonvolatile memory device 1160, a radio signal output from the radio transceiver 1110, or data output from the input device 1120.

Figure 12:
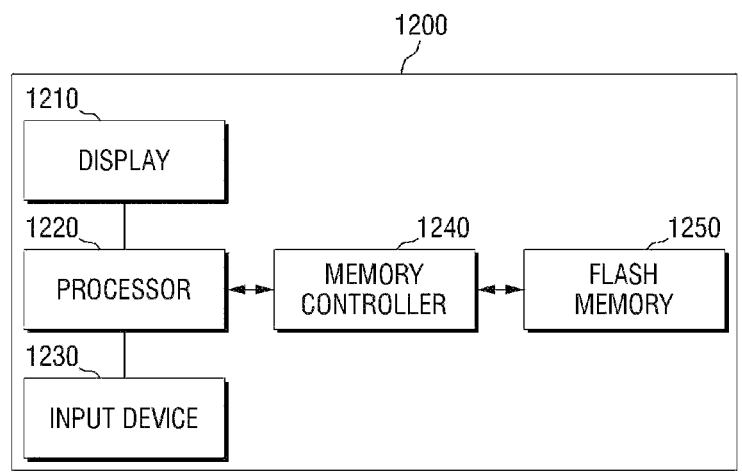
FIG. 12 is a block diagram of an electronic device 1200 including a memory controller 1240 according to at least one example embodiment of inventive concepts.

FIG. 12 is a block diagram of an electronic device 1200 including a memory controller 1240 according to at least one example embodiment of inventive concepts.

Referring to FIG. 12, the electronic device 1200 may be a data processor such as a PC, a table computer, a net-book, an e-reader, a personal digital assistant (PDA), a portable multimedia player (PMP), an MP3 player, or an MP4 player, etc. The electronic device 1200 may include a nonvolatile memory device 1250 such as a flash memory device and the memory controller 1240, which may control the operation of the nonvolatile memory device 1250.

The memory controller 1240 may be the controller 110 shown in FIG. 4. Referring to FIGS. 4 and 12, the memory controller 1240 reads data from the first block 123 of the nonvolatile memory device 120, the first block 123 including a plurality of pages. The memory controller 1240 may detect degraded pages from the pages of the first block 123, count the number of the degraded pages in the first block 123, and determine whether to recharge or reclaim the first block 123 based on the counted number of the degraded pages.

The electronic device 1200 may include a processor 1220 for controlling the overall operation of the electronic device 1200. The memory controller 1240 is controlled by the processor 1220.

In response to an input signal generated by an input device 1230, the processor 1220 may display data stored in the nonvolatile memory device 1250 on a display 1210. The input device 1230 may be, for example, a pointing device such as a touchpad or a computer mouse, a keypad, or a keyboard, etc.

Figure 13:
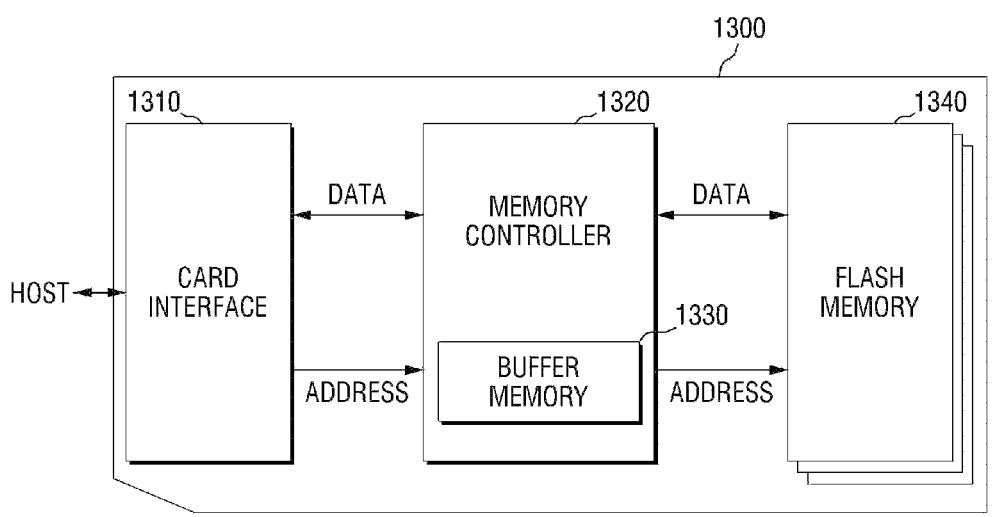
FIG. 13 is a block diagram of an electronic device 1300 including a memory controller 1320 according to at least one example embodiment of inventive concepts.

FIG. 13 is a block diagram of an electronic device 1300 including a memory controller 1320 according to at least one example embodiment of inventive concepts.

Referring to FIG. 13, the electronic device 1300 includes a card interface 1310, the memory controller 1320, and a nonvolatile memory device 1340 (e.g., a flash memory device).

The electronic device 1300 may exchange data with a host HOST through the card interface 1310. According to at least one example embodiment, the card interface 1310 may be, but is not limited to, a secure digital (SD) card interface or a multimedia card (MMC) interface. The card interface 1310 may control data exchange between the host HOST and the memory controller 1320 according to a communication protocol of the host HOST, which can communicate with the electronic device 1300.

The memory controller 1320 may control the overall operation of the electronic device 1300 and control data exchange between the card interface 1310 and the nonvolatile memory device 1340. In addition, a buffer memory 1330 of the memory controller 1320 may buffer data exchanged between the card interface 1310 and the nonvolatile memory device 1340.

The memory controller 1320 may be connected to the card interface 1310 and the nonvolatile memory device 1340 through a data bus DATA and an address bus ADDRESS. According to at least one example embodiment, the memory controller 1320 may receive an address of data to be read or written from the card interface 1310 through the address bus ADDRESS and transmit the received address to the nonvolatile memory device 1340.

In addition, the memory controller 1320 may receive or transmit data to be read or written through the data bus DATA, which is connected to each of the card interface 1310 and the nonvolatile memory device 1340. The memory controller 1320 may be the controller 110 shown in FIG. 4. Referring to FIGS. 4 and 13, the memory controller 1320 reads data from the first block 123 of the nonvolatile memory device 120, the first block including a plurality of pages. The memory controller 1320 may detect degraded pages from the pages of the first block 123, count the number of the degraded pages in the first block 123, and determine whether to recharge or reclaim the first block 123 based on the counted number of the degraded pages.

When the electronic device 1300 of FIG. 13 is connected to the host HOST such as a PC, a table PC, a digital camera, a digital audio player, a mobile phone, console video game hardware or a digital settop box, etc. the host HOST may receive data stored in the nonvolatile memory device 1340 or transmit data to the nonvolatile memory device 1340 through the card interface 1310 and the memory controller 1320.

Figure 14:
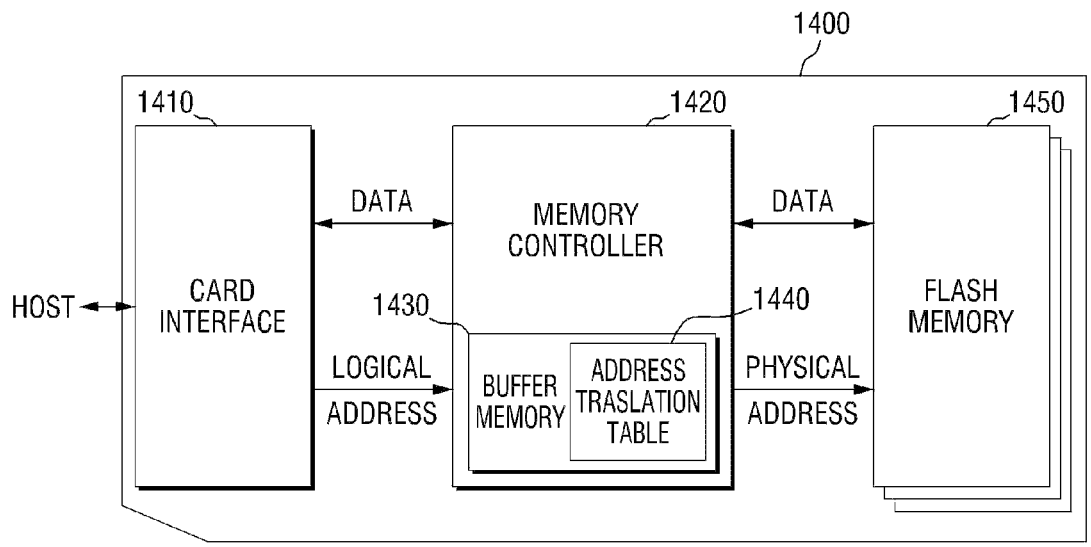
FIG. 14 is a block diagram of an electronic device 1400 including a memory controller 1420 according to at least one example embodiment of inventive concepts.

FIG. 14 is a block diagram of an electronic device 1400 including a memory controller 1420 according to at least one example embodiment of inventive concepts.

Referring to FIG. 14, the electronic device 1400 includes a card interface 1410, the memory controller 1420, and a nonvolatile memory device 1450 (e.g., a flash memory device).

The electronic device 1400 may perform data communication with a host HOST through the card interface 1410. According to at least one example embodiment, the card interface 1410 may be, but is not limited to, an SD card interface or an MMC interface. The card interface 1410 may perform data communication between the host HOST and the memory controller 1420 according to a communication protocol of the host HOST which may communicate with the electronic device 1400.

The memory controller 1420 may control the overall operation of the electronic device 1400 and control data exchange between the card interface 1410 and the nonvolatile memory device 1450.

A buffer memory 1430 included in the memory controller 1420 may store data for controlling the overall operation of the electronic device 1400. The memory controller 1420 may be connected to the card interface 1410 and the nonvolatile memory device 1450 through a data bus DATA and a logical address bus LOGICAL ADDRESS.

According to at least one example embodiment, the memory controller 1420 may receive an address of read data or write data from the card interface 1410 through the logical address bus LOGICAL ADDRESS and transmit the received address to the nonvolatile memory device 1450 through a physical address bus PHYSICAL ADDRESS.

In addition, the memory controller 1420 may receive or transmit read data or write data through the data bus DATA, which is connected to each of the card interface 1410 and the nonvolatile memory device 1450. The memory controller 1420 may be the controller 110 shown in FIG. 4. Referring to FIGS. 4 and 14, the memory controller 1420 reads data from the first block 123 of the nonvolatile memory device 120, the first block 123 including a plurality of pages. The memory controller 1150 may detect degraded pages from the pages of the first block 123, count the number of the degraded pages in the first block 123, and determine whether to recharge or reclaim the first block 123 based on the counted number of the degraded pages.

According to at least one example embodiment, the memory controller 1420 of the electronic device 1400 may include an address translation table 1440 in the buffer memory 1430. The address translation table 1440 may include a logical address input from an external source and a logical address for accessing the nonvolatile memory device 1450. During a write operation, the memory controller 1420 may write new data to a physical address and update the address translation table 1440.

The memory controller 1420 may select a physical address at which both a read operation and a write operation may be performed simultaneously by referring to the address translation table 1440 for a physical address of data being written.

The memory controller 1420 may perform the write operation and the read operation simultaneously and update the address translation table 1440 after the write operation and the read operation. Therefore, the operating time of the electronic device 1400 may be reduced.

When the electronic device 1400 of FIG. 14 is connected to the host HOST such as a PC, a table PC, a digital camera, a digital audio player, a mobile phone, console video game hardware or a digital settop box, the host HOST may receive data stored in the nonvolatile memory device 1450 or transmit data to be stored in the nonvolatile memory device 1450 through the card interface 1410 and the memory controller 1420.

Figure 15:
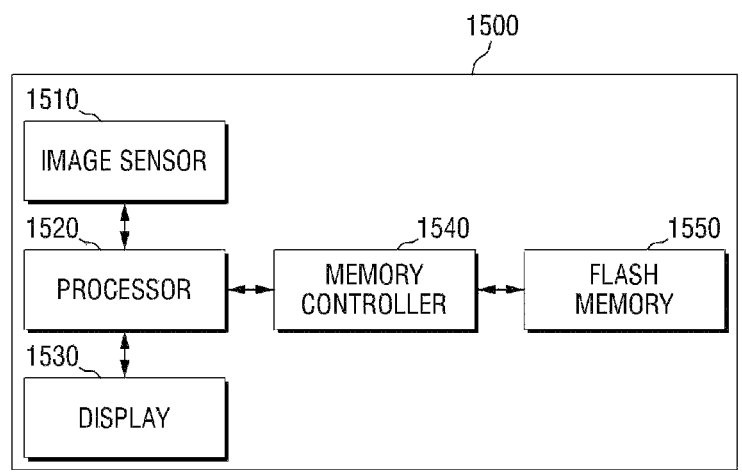
FIG. 15 is a block diagram of an electronic device 1500 including a memory controller 1540 according to at least one example embodiment of inventive concepts.

FIG. 15 is a block diagram of an electronic device 1500 including a memory controller 1540 according to at least one example embodiment of inventive concepts.

Referring to FIG. 15, the electronic device 1500 includes a nonvolatile memory device 1550 such as a flash memory device, the memory controller 1540 which controls the data processing operation of the nonvolatile memory device 1550, and a processor 1520 which controls the overall operation of the electronic device 1500.

The memory controller 1540 may be the controller 110 shown in FIG. 4. Referring to FIGS. 4 and 15, the memory controller 1540 reads data from the first block 123 of the nonvolatile memory device 120, the first block 123 including a plurality of pages. The memory controller 1150 may detect degraded pages from the pages of the first block 123, count the number of the degraded pages in the first block 123, and determine whether to recharge or reclaim the first block 123 based on the counted number of the degraded pages.

An image sensor 1510 of the electronic device 1500 may convert an optical signal into a digital signal, which may be stored in the nonvolatile memory device 1550 or displayed on a display 1530 under the control of the processor 1520. The digital signal stored in the nonvolatile memory device 1550 may be displayed on the display 1530 under the control of the processor 1520.

Figure 16:
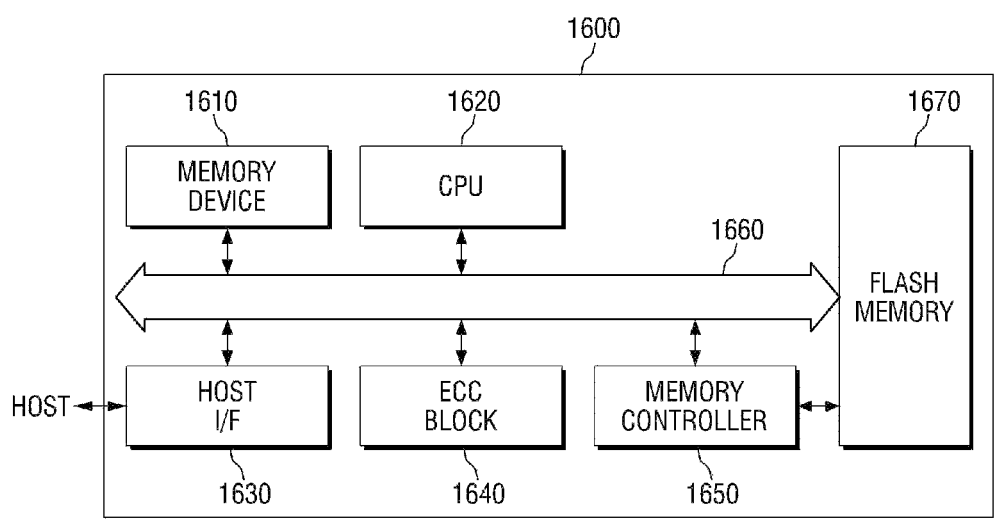
FIG. 16 is a block diagram of an electronic device 1600 including a memory controller 1650 according to at least one example embodiment of inventive concepts.

FIG. 16 is a block diagram of an electronic device 1600 including a memory controller 1650 according to at least one example embodiment of inventive concepts.

Referring to FIG. 16, the electronic device 1600 includes a nonvolatile memory device 1670 such as a flash memory device, the memory controller 1650 which controls the operation of the nonvolatile memory device 1670, and a central processing unit (CPU) 1620 which controls the overall operation of the electronic device 1600.

The electronic device 1600 includes a memory device 1610 that may be used as an operation memory of the CPU 1620. The memory device 1610 may be a nonvolatile memory such as a ROM or a volatile memory such as a dynamic random access memory (DRAM).

A host HOST connected to the electronic device 1600 may exchange data with the nonvolatile memory device 1670 through the memory controller 1650 and a host interface 1630. The memory controller 1650 may function as a memory interface, for example, a flash memory interface. The memory controller 1650 may be the controller 110 shown in FIG. 4. Referring to FIGS. 4 and 16, the memory controller 1150 reads data from the first block 123 of the nonvolatile memory device 120, the first block 123 including a plurality of pages. The memory controller 1150 may detect degraded pages from the pages of the first block 123, count the number of the degraded pages in the first block 123, and determine whether to recharge or reclaim the first block 123 based on the counted number of the degraded pages.

According to at least one example embodiment, the electronic device 1600 may further include an ECC block 1640. The ECC block 1640 may be controlled by the CPU 1620 and may detect and correct errors included in data read from the nonvolatile memory device 1670 through the memory controller 1650.

The CPU 1620 may control data exchange between the memory controller 1650, the ECC block 1640, the host interface 1630, and the memory device 1670 through a bus 1660. The electronic device 1600 may be implemented as a universal serial bus (USB) memory drive or a memory stick.

While example embodiments have been particularly shown and described, it will be understood by one of ordinary skill in the art that variations in form and detail may be made therein without departing from the spirit and scope of the claims.

What is claimed is:

1. A method of operating a memory controller, the method comprising:
    reading data from a first block of a memory device;
    detecting degraded pages from a plurality of pages of the first block and counting a number of the degraded pages in the first block, the degraded pages containing data having a programmed state distribution changed by charge loss;
    performing a recharging operation when the counted number of the degraded pages is greater than a first reference value and less than or equal to a second reference value, the second reference value being greater than the first reference value; and
    performing a reclaiming operation when the counted number of the degraded pages is greater than the second reference value, wherein
        the recharging operation includes reprogramming error corrected bits of the data into a page of the first block having the same address as a page from which the data was read,
        the reclaiming operation includes reprogramming error corrected bits of the data into a second block, the first block having a different physical address than the second block, and
        the first block and the second block are in a same memory array of the memory device.

2. The method of claim 1, wherein the page is determined to be a degraded page when a bit error rate of data read from a page of the first block is greater than a reference level.

3. The method of claim 1, wherein a page is determined to be a degraded page when the page is unsuccessfully read using a first voltage, the page is read using a second read voltage and a difference between the first read voltage and the second read voltage is greater than a third reference value.

4. The method of claim 3, wherein the page is read successfully read using the second read voltage.

5. The method of claim 1, wherein a page is determined to be a degraded page based on time stamp information.

6. The method of claim 5, wherein the time stamp information includes information about a time when a corresponding page was programmed, the time stamp information being stored in a spare region of the corresponding page.

7. A memory system comprising:
    a nonvolatile memory device including a first block including a plurality of pages; and
    a controller configured to control the nonvolatile memory device, the controller including,
    a microprocessor configured to detect degraded pages from the plurality of pages of the first block, the degraded pages containing data having a programmed state distribution changed by charge loss; and
    a counter configured to count a number of the detected degraded pages and send the counted number of the degraded pages to the microprocessor, the microprocessor being configured to,
        perform a recharging operation when the counted number of the degraded pages is greater than a first reference value and less than or equal to a second reference value, the second reference value being greater than the first reference value, and
        perform a reclaiming operation when the counted number of the degraded pages is greater than the second reference value, wherein
            the microprocessor is configured to perform the recharging operation by reprogramming error corrected bits of data read from a the first block into a page of the first block having the same address as a page from which the data was read,
            the microprocessor is configured to perform the reclaiming operation by reprogramming error corrected bits of the data into a second block,
            the first block has a different physical address than the second block, and
            the first and second blocks are in a same memory cell array of the nonvolatile memory device.

8. The memory system of claim 7, wherein the microprocessor determines the page to be a degraded page when a bit error rate of data read from a page of the first block is greater than a reference level.

9. The memory system of claim 7, wherein the microprocessor determines a page to be a degraded page if the page fails to be read using a first read voltage but is read successfully using a second read voltage, and a difference between the first read voltage and the second read voltage is greater than a third reference value.

10. A memory system comprising:
    a memory device including a first block, the first block including a plurality of pages; and
    a memory controller configured to control the memory device, the memory controller including,
    a microprocessor configured to,
        measure a voltage threshold shift of the plurality of pages, adjust a read voltage according to the voltage threshold shift, and detect degraded pages of the first block, the degraded pages containing data having a programmed state distribution changed by charge loss,
        perform a recharging operation when the counted number of the degraded pages is greater than a first reference value and less than or equal to a second reference value, the second reference value being greater than the first reference value, and
        perform a reclaiming operation when the counted number of the degraded pages is greater than the second reference value, and a counter configured to count a number of the detected degraded pages of the first block and send the counted number to the microprocessor, wherein the microprocessor is configured to perform the recharging operation by reprogramming error corrected bits of data read from a the first block into a page of the first block having the same address as a page from which the data was read, the microprocessor is configured to perform the reclaiming operation by reprogramming error corrected bits of the data into a second block, the first block has a different physical address than the second block, and the first and second blocks are in a same memory cell array of the nonvolatile memory device.

11. The memory system of claim 10, wherein the microprocessor is configured to determine a page to be a degraded page if a bit error rate of data read from a page of the first block is greater than a reference value.

12. The memory system of claim 10, wherein the microprocessor is configured to determine a page to be a degraded page when the page is unsuccessfully read using a first voltage, the page is read using a second read voltage and a difference between the first read voltage and the second read voltage is greater than a third reference value.

13. The memory system of claim 12, wherein the page is read successfully read using the second read voltage.

14. The memory system of claim 10, wherein the microprocessor is configured to determine a page to be a degraded page based on time stamp information which includes information about a time when a corresponding page was programmed and is stored in a spare region of the corresponding page.

* * * * *